(12) United States Patent
Patel et al.

(10) Patent No.: US 6,208,569 B1
(45) Date of Patent: Mar. 27, 2001

(54) METHOD OF AND APPARATUS FOR SHARING REDUNDANCY CIRCUITS BETWEEN MEMORY ARRAYS WITHIN A SEMICONDUCTOR MEMORY DEVICE

(75) Inventors: Vipul Patel, San Jose; Daniel F. McLaughlin, Santa Clara; Terry T. Tsai, San Jose, all of CA (US)

(73) Assignee: Genesis Semiconductor, Inc., San Jose, CA (US)

( * ) Notice: Subject to any disclaimer, the term of this patent is extended or adjusted under 35 U.S.C. 154(b) by 0 days.

(21) Appl. No.: 09/356,805

(22) Filed: Jul. 20, 1999

Related U.S. Application Data (60) Provisional application No. 60/128,040, filed on Apr. 6, 1999.

(51) Int. Cl.[7] ................................................. G11C 13/00
(52) U.S. Cl. ...................... 365/200; 365/210; 365/185.09
(58) Field of Search .................................. 365/200, 210, 365/185.09

(56) References Cited

U.S. PATENT DOCUMENTS

| 5,889,727 | 3/1999 | Hsu et al. | ............................ 365/233 |
|---|---|---|---|
| 5,930,194 | 7/1999 | Yamagata et al. | .............. 365/230.03 |
| 6,040,999 | * 3/2000 | Hotta et al. | ........................... 365/200 |
| 6,046,945 | * 4/2000 | Su et al. | ................................. 365/200 |
| 6,052,318 | * 4/2000 | Kirihata et al. | ...................... 365/200 |

* cited by examiner

Primary Examiner—Terrell W. Fears
(74) Attorney, Agent, or Firm—Haverstock & Owens LLP (57) ABSTRACT

An apparatus for sharing redundancy circuits between memory arrays within a semiconductor memory device includes at least two main memory arrays comprised of a plurality of memory cells aligned in rows and/or columns and a shared redundancy circuit. The redundancy circuits preferably include a plurality of redundancy rows and a redundancy decoder which is configured for accessing the redundancy rows whenever a read or write operation involves use of a defective row within the main memory arrays for which a redundant row has been substituted. Preferably, each main memory array has access to the shared redundancy circuit. The shared redundancy circuit is used for substituting defective rows within a corresponding main memory array. The shared redundancy circuit provides extra redundant capacity to both of the main memory arrays.

19 Claims, 6 Drawing Sheets

METHOD OF AND APPARATUS FOR SHARING REDUNDANCY CIRCUITS BETWEEN MEMORY ARRAYS WITHIN A SEMICONDUCTOR MEMORY DEVICE

RELATED APPLICATIONS

This application claims priority under 35 U.S.C. § 119(e) of the co-pending U.S. provisional application Ser. No. 60/128,040 filed on Apr. 6, 1999 and entitled "METHOD OF AND APPARATUS FOR SHARING REDUNDANCY CIRCUITS BETWEEN MEMORY ARRAYS WITHIN A SEMICONDUCTOR MEMORY DEVICE." The provisional application Ser. No. 60/128,040 filed on Apr. 6, 1999 and entitled "METHOD OF AND APPARATUS FOR SHARING REDUNDANCY CIRCUITS BETWEEN MEMORY ARRAYS WITHIN A SEMICONDUCTOR MEMORY DEVICE" is also hereby incorporated by reference.

FIELD OF THE INVENTION

The present invention generally relates to semiconductor memory devices. More particularly, the present invention relates to redundancy circuits within semiconductor memory devices.

BACKGROUND OF THE INVENTION

Random access memory (RAM) is a component used within electronic systems to store data for use by other components within the system. Dynamic RAM (DRAM) is a type of RAM which uses a capacitor-type storage and requires periodic refreshing in order to maintain the data stored within the DRAM. Static RAM (SRAM) is another type of RAM which retains the information stored within the SRAM as long as power is applied. SRAM does not require periodic refreshing in order to maintain the stored data. Synchronous DRAM (SDRAM) operates within a synchronous memory system such that input and output signals are synchronized to an active edge of a system clock.

RAM is generally organized within the system into addressable blocks, each containing a predetermined number of memory cells. Each memory cell within a RAM represents a bit of information. The memory cells are organized into rows and columns. Each row of memory cells forms a word. Each memory cell within a row is coupled to the same wordline which is used to activate the memory cells within the row. The memory cells within each column of a block of memory are also each coupled to a pair of bitlines. These bitlines are also coupled to local input/output (LIO) lines. These local input/output lines are used to read data from an activated memory array or write data to an activated memory array. The pair of bitlines includes a bitline and an inverse bitline. A memory cell is therefore accessed by activating the appropriate wordline and pair of bitlines.

Memory circuits are fabricated on wafers. Wafer yield is defined as the ratio of non-defective chips to the number of total chips fabricated on a given wafer. In general, as integration density in semiconductor memory devices increases, the likelihood of defective cells in any one memory array also increases. Therefore, the higher the integration density of chips fabricated on a given wafer, the lower the wafer yield.

It has been determined that an effective method for increasing wafer yield is to use redundant memory to replace defective memory. Redundant memory includes redundant memory cells which are configured in rows and/or columns and are used to replace rows and/or columns of the main memory array which are found to have one or more defective memory cells.

Figure 1:
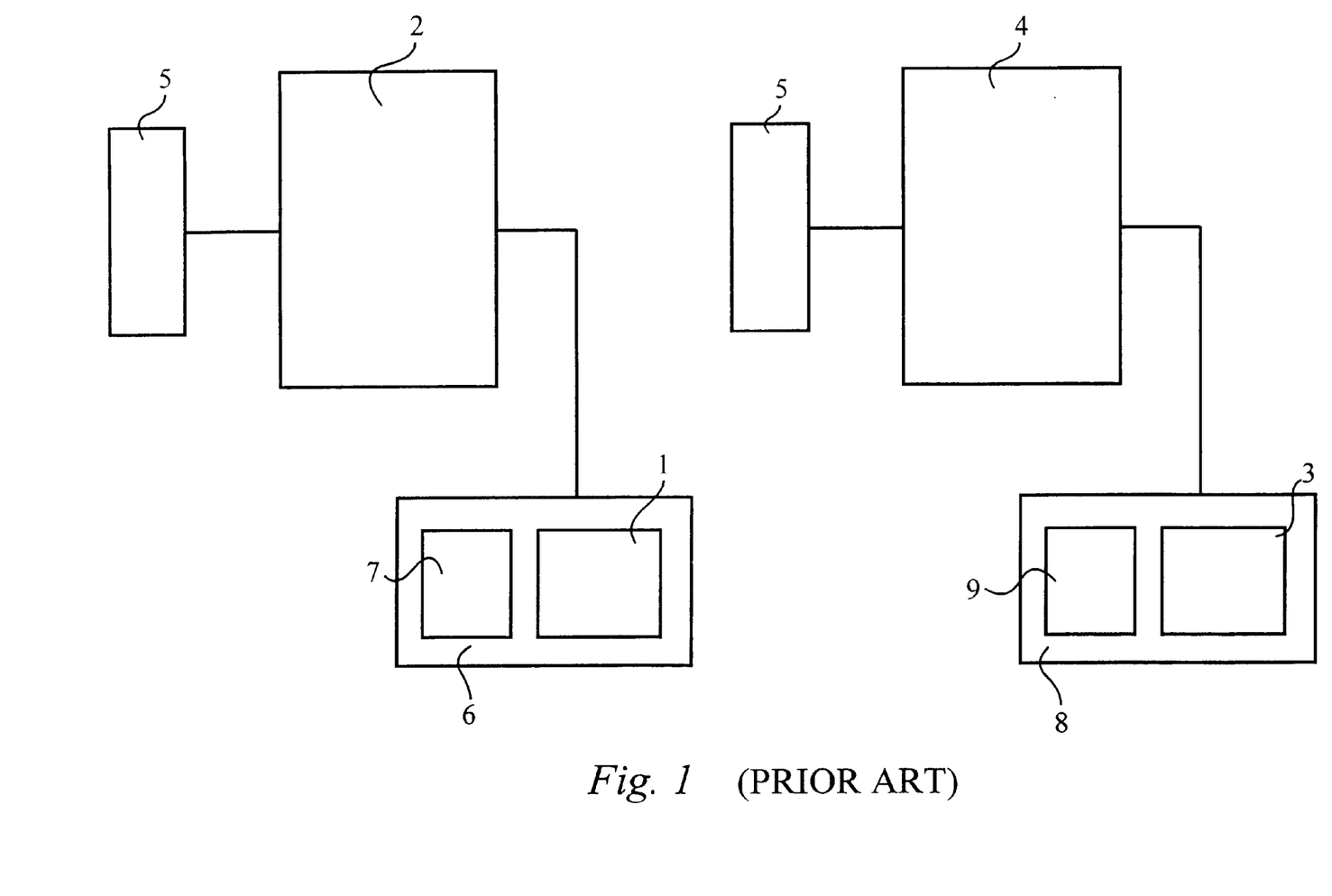
FIG. 1 is a representational block diagram of the organizational structure of a typical prior art main memory and redundant memory configuration, including the decoders therefor.

A block diagram of a two-array memory circuit with a redundant memory circuit for each main memory array is illustrated in FIG. 1. A first redundant memory circuit 6 is associated with the main memory array 2, while a second redundant memory circuit 8 is associated with the main memory array 4. Each main memory array has a corresponding memory controller 5. The redundant memory circuits 6 and 8 each have a redundancy memory array 1 and 3, respectively, and a redundancy decoder circuit 7 and 9, respectively. The redundancy memory arrays 1 and 3 are groups of redundancy memory cells arranged in rows and/or columns.

Initially, the redundancy memory arrays 1 and 3 have unspecified addresses. After fabrication, the memory cells within the main memory arrays 2 and 4 are tested. The redundant memory rows and/or columns are then used to replace rows and/or columns within the main memory arrays 2 and 4 which are found to include defective memory cells. The redundant decoder circuits 7 and 9 are programmable in such a manner as to match the addresses of rows and/or columns within the main memory arrays 2 and 4 which include defective memory cells. The defective rows and/or columns within the main memory arrays 2 and 4 are then decoupled or disabled, either electrically using the output of the appropriate redundant decoder circuit 7 and 9, or physically with a local fuse.

Figure 2:
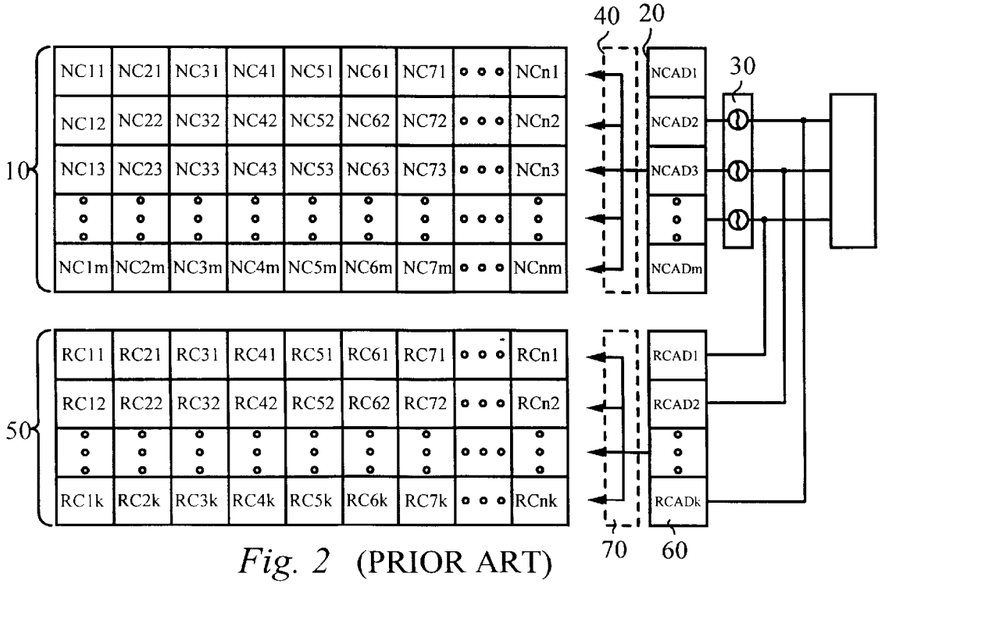
FIG. 2 is a more detailed diagram of the typical prior art memory and row redundancy configuration.

A more detailed representational block diagram of the organizational structure of a typical main memory array and redundant memory array configuration is illustrated in FIG. 2. As shown, the configuration includes two normal n×m main memory arrays 10, wherein n is the number of rows in each array and m is the number of columns. The configuration further includes two redundant memory arrays 50 of n×k dimensions, where n is the number of redundancy rows in each redundant memory array and k is the number of redundancy columns.

Initially, the redundancy rows in the redundancy memory arrays 50 have no programmed addresses. Instead, redundancy address decoders 60 are coupled between the redundancy memory arrays 50 and the normal memory arrays 10. When a defective cell is discovered in testing of the memory device, the redundancy address decoders 60 match the addresses of the defective rows to redundancy rows in the redundancy memory arrays 50. After the address of the defective row is mapped to a row within the redundant memory array, the defective row is decoupled or disabled. The more rows available in the redundancy memory array 50, the more rows with defective cells in the normal memory arrays 10 which can be replaced.

In operation, when a memory write or read cycle is executed, access to the defective row within the normal memory array 10 is prevented because the redundant address decoders 60 are responsive only to the addresses of the redundant rows 50. If the write or read cycle involves a defective memory cell, then the redundant address decoders 60 will recognize the address and route the information to or from the proper redundancy row within the redundant memory array 50. If the redundant address decoders 60 do not recognize the address, the read or write operation will be performed as usual, with the information being routed to and from the main memory arrays 10. Normal row address decoders 20 and normal row drivers 40 are used to control the flow of information to and from the normal memory arrays 50.

Alternatively, and as an additional assurance of accuracy, the memory configuration may include an accompanying fuse array 30 wherein a polysilicon fusible link is connected to each row address within the normal main memory array 10. When a defective memory cell is discovered within the normal memory array 10, an available redundancy row within the redundant memory array 50 will be programmed by the redundant address decoder 60, and the defective row within the main memory array 10 is disabled by blowing the polysilicon fusible link to the row address corresponding to the defective row within the normal memory array 10.

Figure 3:
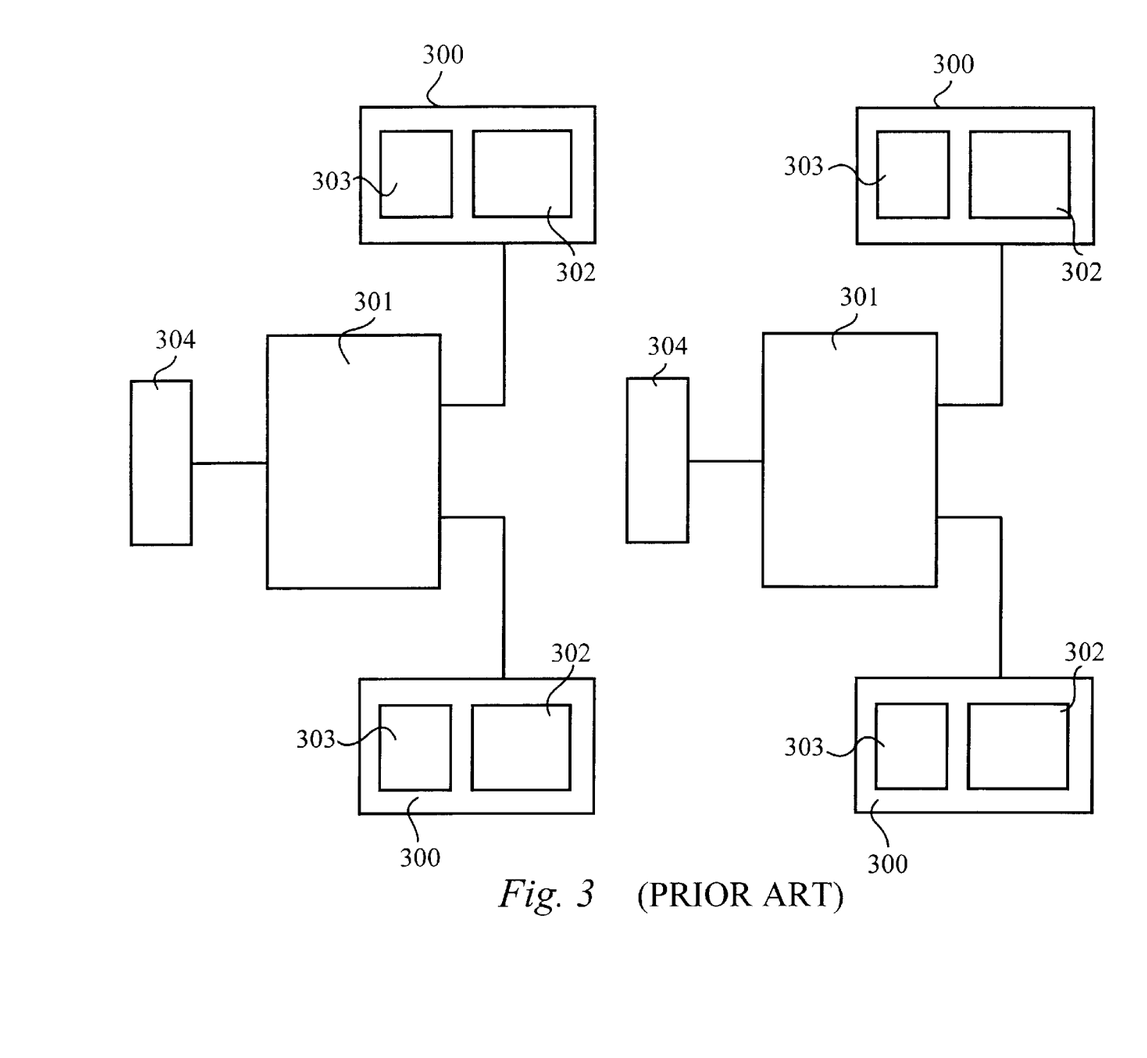
FIG. 3 is a representational block diagram of a prior art redundancy memory configuration using two redundant memory circuits per main memory array.

The typical configuration of one redundant redundant memory array per normal memory array is often insufficient for replacing all defective cells within the normal memory array. Often, multiple redundant memory arrays will be used per normal memory array in order to increase wafer yield of the memory device. FIG. 3 shows a block diagram of a redundancy memory configuration using two redundant memory circuits 300 per normal memory array 301. The normal memory arrays 301 are each accompanied by a memory controller 304. Each redundant memory circuit 300 includes a redundancy row memory array 302 and a redundancy row address decoder circuit 303. The redundancy row address decoder circuit 303 is used to program the redundancy memory array 302 whenever a defective cell is discovered within the normal memory array 301. As more redundancy memory circuits 300 are used, the wafer yield is increased.

However, in a semiconductor memory with multiple normal memory arrays 301, each additional redundancy memory circuit 300 requires significant space and additional trace layout on the die on which the memory circuit is formed. Furthermore, each redundancy memory circuit 300 requires its own redundant row address decoder 302 and redundancy row driver 303, which also demand additional space and trace layout on the die. These additional costs and space requirements make the typical redundancy memory configuration unappealing. What is needed is an improved redundancy memory configuration which increases wafer yield and requires less die space to implement.

SUMMARY OF THE INVENTION

An apparatus for sharing redundancy circuits between memory arrays within a semiconductor memory device includes at least two main memory arrays comprised of a plurality of memory cells aligned in rows and/or columns and a shared redundancy circuit. The redundancy circuits preferably include a plurality of redundancy rows and a redundancy decoder which is configured for accessing the redundancy rows whenever a read or write operation involves use of a defective row within the main memory arrays for which a redundant row has been substituted.

Preferably, each main memory array has access to the shared redundancy circuit. The shared redundancy circuit is used for substituting defective rows within a corresponding main memory array. The shared redundancy circuit provides extra redundant capacity to both of the main memory arrays. In this way, in a memory device having multiple main memory arrays, the number of redundancy circuits required to implement an effective redundancy memory configuration is reduced.

In the preferred embodiment of the present invention, each redundancy decoder includes a fuse array comprised of a plurality of polysilicon fuses which are connected to each row in the normal memory array. After a redundancy row is programmed to replace a defective row within one of the two main memory arrays, a polysilicon fuse in the accompanying fuse array is blown in order to disable the connection to the corresponding row within the main memory array. The fuse array within the shared redundancy circuit is coupled to both of the main memory arrays such that the two main memory arrays will share one fuse array and one redundancy address decoder for the shared redundancy circuit.

In one aspect of the present invention, a method of providing redundant memory within a memory circuit includes the steps of fabricating a plurality of main memory arrays including groups of main memory cells, fabricating a redundant memory array including groups of redundant memory cells, testing the groups of main memory cells in order to determine if any of the groups of main memory cells include a defective memory cell and substituting groups of redundant memory cells for groups of main memory cells including one or more defective memory cells if defective memory cells are discovered within the groups of main memory cells, wherein the groups of redundant memory cells are shared between the plurality of main memory arrays. The groups of redundant memory cells are rows within the redundant memory array and the groups of main memory cells are rows within the main memory arrays. The method also includes the steps of determining an address for groups of main memory cells including one or more defective memory cells, assigning the address to a group of redundant memory cells which are substituted for the group of main memory cells found to include one or more defective memory cells and disabling the group of main memory cells for which the group of redundant memory cells is substituted.

In another aspect of the present invention, a redundant memory circuit configured for coupling to two main memory arrays and including a plurality of memory cells arranged into groups of redundant memory cells for substituting the groups of redundant memory cells for groups of defective main memory cells within the two main memory arrays. The groups of redundant memory cells are rows within the redundant memory circuit. The redundant memory circuit further includes a redundancy address decoder coupled to the groups of redundant memory cells for matching a row address within the groups of redundant memory cells with a defective row address within one of the two main memory arrays whenever a defective memory cell is discovered.

In yet another aspect of the present invention, an apparatus for providing redundant memory to a plurality of main memory arrays includes a plurality of main memory arrays including groups of main memory cells and a redundant memory circuit including groups of redundant memory cells and coupled to the plurality of main memory circuits for substituting the groups of redundant memory cells for the groups of main memory cells including one or more defective memory cells. The groups of redundant memory cells are formed within a redundant memory array which is shared between the plurality of main memory arrays. The groups of redundant memory cells are rows within the redundant memory array and the groups of main memory cells are rows within the main memory arrays. The apparatus further includes a means for determining an address of a group of main memory cells which is discovered to have one or more defective memory cells, a means for assigning an identical address to a group of redundant memory cells which are substituted for the group of main memory cells including one or more defective memory cells and a means for disabling the group of main memory cells which are found to include the defective memory cell.

In still another aspect of the present invention, a redundancy memory configuration for a semiconductor memory device includes a plurality of main memory arrays each including a plurality of memory cells arranged in a matrix of main rows and main columns, a shared redundancy circuit coupled to the main memory arrays, including a plurality of redundancy rows and a means for programming the shared redundancy circuit coupled between the main memory arrays and to the shared redundancy circuit for substituting one of the redundancy rows in the shared redundancy circuit for a main row having a defective memory cell. The means for programming includes a redundancy driving means for controlling access to the plurality of redundancy rows during memory read/write operations. The redundancy memory configuration further includes a redundancy address decoder which matches a row address within the plurality of redundancy rows with a defective row address within one of the main memory arrays whenever a defective memory cell is discovered. The means for programming includes a programmable array. The programmable array includes a plurality of programmable elements, wherein each programmable element is coupled to a row address in each of the two normal memory arrays and further wherein each programmable element is programmed if a defective cell is discovered within either row to which the programmable element is coupled.

In still another aspect of the present invention, a memory circuit includes a first main memory array including a first plurality of memory cells arranged into a first matrix of rows and columns, a first dedicated redundancy memory array coupled to the first main memory array and including a second plurality of memory cells arranged into first groups of redundant memory cells, wherein the first groups of redundant memory cells are substituted for memory cells within the first main memory array, a second main memory array including a third plurality of memory cells arranged into a second matrix of rows and columns, a second dedicated redundancy memory array coupled to the second main memory array and including a fourth plurality of memory cells arranged into second groups of redundant memory cells and a shared redundancy memory array coupled to both the first and second main memory arrays and including a fifth plurality of memory cells arranged into third groups of redundant memory cells which are substituted for memory cells within both the first and second main memory arrays. The memory circuit further includes a shared redundancy decoder coupled to the shared redundancy memory for substituting a row with a defective memory cell within a selective one of the first and second matrices with one of the third groups of redundant memory cells. The shared redundancy decoder includes a programmable array. The shared redundancy decoder includes a redundancy driver means coupled to the shared redundancy memory array for controlling access to the third groups of redundant memory cells during memory read/write operations.

DETAILED DESCRIPTION OF THE PREFERRED EMBODIMENT

A memory circuit, according to the present invention, includes at least two normal memory arrays and a shared redundancy circuit. The shared redundancy circuit is shared between the two main memory arrays and used to replace defective rows within either or both of the two main memory arrays. The shared redundancy circuit preferably includes a plurality of redundancy rows and a redundancy decoder which is configured to access the redundancy rows whenever a read or write operation involves use of a defective row within one of the two main memory arrays for which a redundant row has been substituted.

Figure 4:
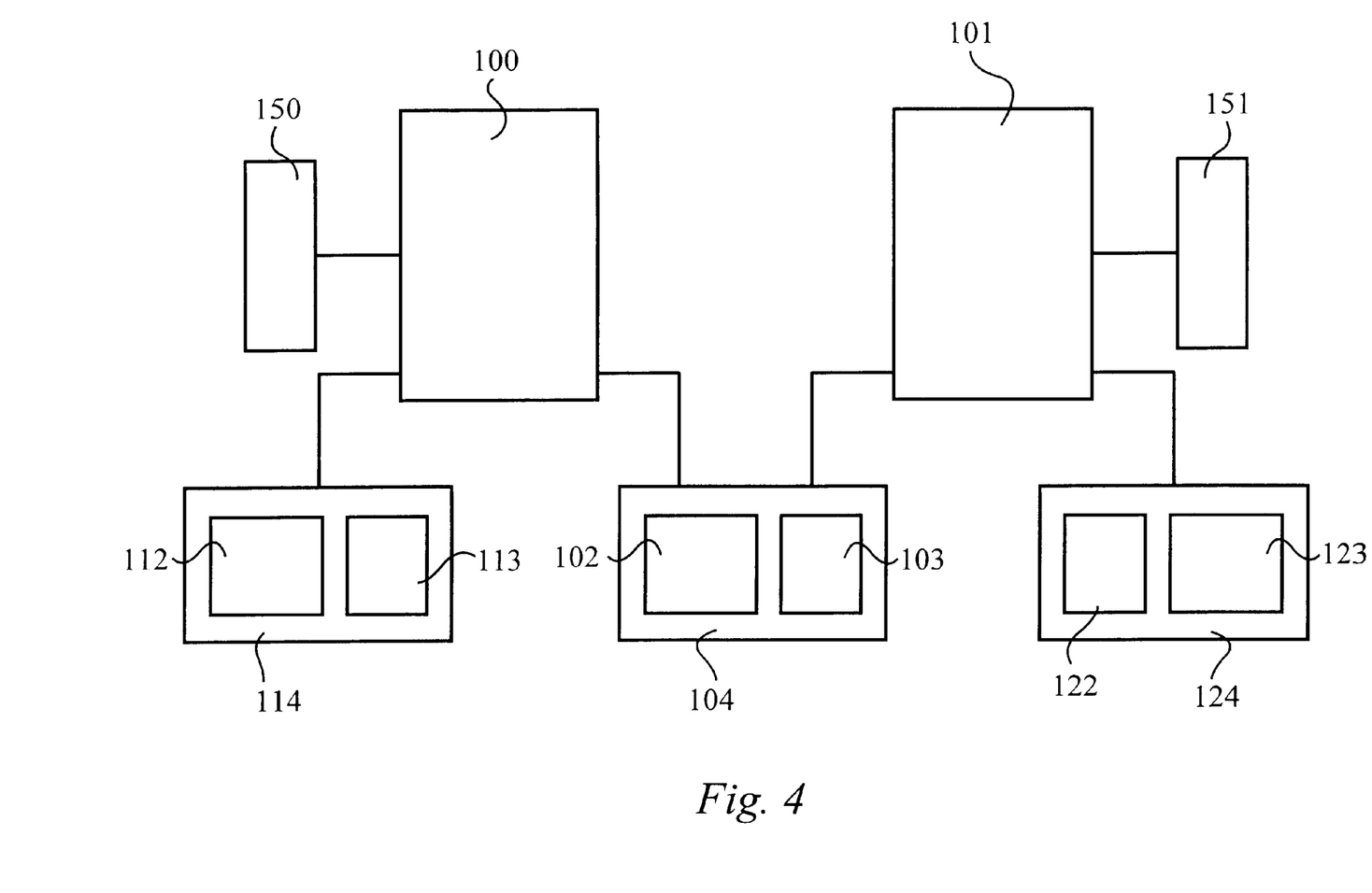
FIG. 4 is a representational block diagram for the memory and row redundancy configuration of the preferred embodiment of the present invention.

FIG. 4 illustrates a block diagram of the multi-array memory and row redundancy configuration of the preferred embodiment of the present invention. Two block memory arrays 100 and 101 are coupled to two individual memory controllers 150 and 151 respectively. Each of the block memory arrays 100 and 101 is coupled to a dedicated, corresponding, redundancy memory circuit 114 and 124, respectively. A shared redundancy memory circuit 104 is coupled between the two block memory arrays 100 and 101. The shared redundancy memory circuit 104 includes a redundant memory row array 102 and a redundancy decoder circuit 103. Each of the dedicated redundancy memory circuits includes a dedicated redundant memory row array 112 and 122 and a dedicated redundancy decoder 113 and 123. The two block memory arrays 100 and 101 share the redundant memory row array 102 and the redundancy decoder circuit 103 within the shared redundancy circuit 104.

Figure 5:
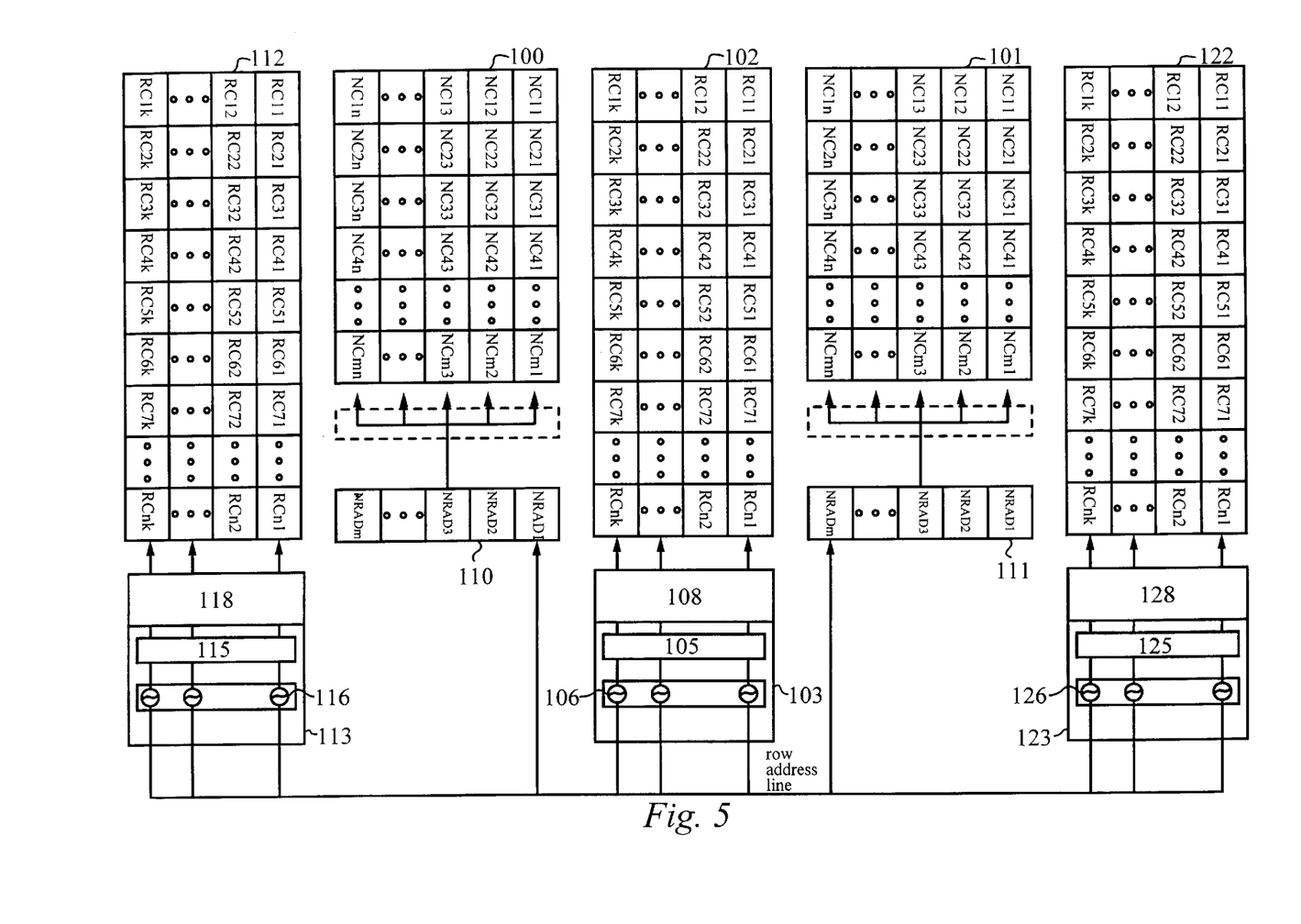
FIG. 5 is a more detailed block diagram of the memory and row redundancy configuration of the present invention.

FIG. 5 shows a more detailed block diagram of the memory and row redundancy configuration of the present invention. As can be seen, the invention includes at least two m×n normal or main memory arrays 100 and 101, one n×k shared redundant memory row array 102, and two n×k end redundant memory arrays 112 and 122. The shared redundant memory row array 102 is coupled to a shared redundancy decoder circuit 103 which is in turn coupled to both of the normal memory arrays 100 and 101. The end redundant memory row array 112 is coupled to a redundancy decoder circuit 113. The end redundant memory row array 122 is coupled to a redundancy decoder circuit 123.

Each of the redundancy decoder circuits 103, 113 and 123 includes a redundancy driver 108, 118 and 128, respectively, a redundancy address decoder 105, 115 and 125, respectively, and a programmable array 106, 116 and 126, respectively. In the preferred embodiment, the programmable arrays 106, 116 and 126 are comprised of a fuse array; however, it should be understood that any alternate means for programming may be used such as an eprom or antifuse array. The programmable arrays 106, 116 and 126 are each comprised of a plurality of programmable elements which when decoded link to each of the row addresses 1 through m in the corresponding normal memory arrays 100 and 101. In the preferred embodiment, the plurality of programmable elements include a plurality of fuses, wherein each fuse is coupled to each of the row addresses 1 through m in the normal memory arrays 100 and 101. The programmable arrays 106, 116 and 126 are used to program the redundancy memory row array 102. When a defective cell in one of the normal memory arrays 100 and 101 is discovered during testing, the corresponding redundancy address decoder 105, 115 or 125 is then programmed to match the redundancy row address of a row in the corresponding redundancy memory row array 102, 112 or 122, with the address of the defective row in the normal memory array 100 or 101. Accordingly, the row within the main memory will not be available for memory but, instead, will be replaced by the corresponding row in the redundancy memory row array 102. In this way, the shared redundancy address decoders 105, 115 and 125 match the correct row within the redundancy memory row array 102, 112 and 122, respectively, with the defective row address whenever there is an attempt to access the normal row address. The appropriate programmable arrays 106, 116 or 126 will then disable the row in which the defective cells lies. If the shared programmable array 106 is being used then the row in which the defective cell lies is disabled along with the corresponding row in the neighboring normal memory array. In the preferred embodiment, disabling of a row is done by blowing the fuse coupled to the defective row address. Accordingly, those rows within the normal memory arrays will not be available for memory; but, instead, will be replaced by the corresponding row in the redundancy memory row array 102. As an example, if the third row in memory array 100 is found to contain a defective cell during testing, the redundancy address decoder 105 will program an available row within the redundancy memory row array 102 to match the redundancy row address with the address of the defective row. Then, both the third row in memory array 100, and the third row in memory array 101 will be disabled by the programmable array 106. In the preferred embodiment, this is done by blowing the fuse to the normal row address corresponding with row 3.

The redundancy address decoders 105, 115 and 125 are only responsive to addresses which have been programmed in the corresponding redundancy memory row array 102, 112 and 122. Thus, during normal read or write operations, the redundancy address decoders 105, 115 and 125 will determine whether the operation involves any of the rows in the corresponding redundancy memory row array 102, 112 and 122. If so, the information to be read from memory will be retrieved from the appropriate redundancy memory row array 102, 112 or 122, or the information to be written to memory will be stored in the appropriate redundancy memory row array 102, 112 or 122.

In the preferred embodiment, each of the normal memory arrays 100 and 101 has an accompanying dedicated end redundancy memory array 112 and 122. This is because both of the normal memory arrays 100 and 101 are end arrays in this configuration. It should be apparent to those skilled in the art that in configurations having more than two normal memory arrays, the end arrays will each have dedicated redundancy memory arrays and the center arrays will have access to shared redundancy arrays. It should also be apparent to those skilled in the art, that other such configurations including shared redundancy arrays are possible.

After fabrication, the memory cells within the main memory arrays 100 and 101 are tested. Preferably, the redundant memory rows within the dedicated redundancy memory arrays 112 and 122 are then first used to replace rows which are found to include defective memory cells within each of the normal memory arrays 100 and 101, respectively. Unlike the shared redundancy memory array 102, whenever a defective row within one of the normal memory arrays 100 and 101 is replaced with a row in the dedicated redundancy memory arrays 112 and 122, the corresponding row in the neighboring normal memory array is not disabled. When either of the dedicated redundancy memory arrays 112 and 122 have been fully utilized, the redundant memory rows within the shared redundancy memory array 102 are then used to replace defective rows within the normal memory arrays 100 and 101.

Each of the dedicated redundancy memory arrays 112 and 122 has an accompanying redundancy decoder 113 and 123. The redundant address decoders 105, 115 and 125 are programmed to match the addresses of rows within the normal memory arrays 100 and 101 which are found to include defective memory cells with the corresponding rows in the redundancy memory row arrays 102, 112, and 122 which are used for replacement.

Each of the dedicated end redundancy memory arrays 112 and 122 also has a programmable array 116 and 126, respectively, which is used to disable rows with defective memory cells within the two normal memory arrays 100 and 101. In the preferred embodiment, the programmable array is comprised of a fuse array; however, it should be understood that any alternate means for programming may be used including an eprom or antifuse array. Preferably, programmable elements within each of the programmable arrays 116 and 126 are connected to each row in the normal memory arrays 100 and 101. In the preferred embodiment, the plurality of programmable elements is a plurality of fuses, wherein each fuse is coupled to each of the row addresses 1 through m in the normal memory arrays 100 and 101. The defective rows are preferably disabled by blowing the appropriate fuse connected to that row.

Figure 6:
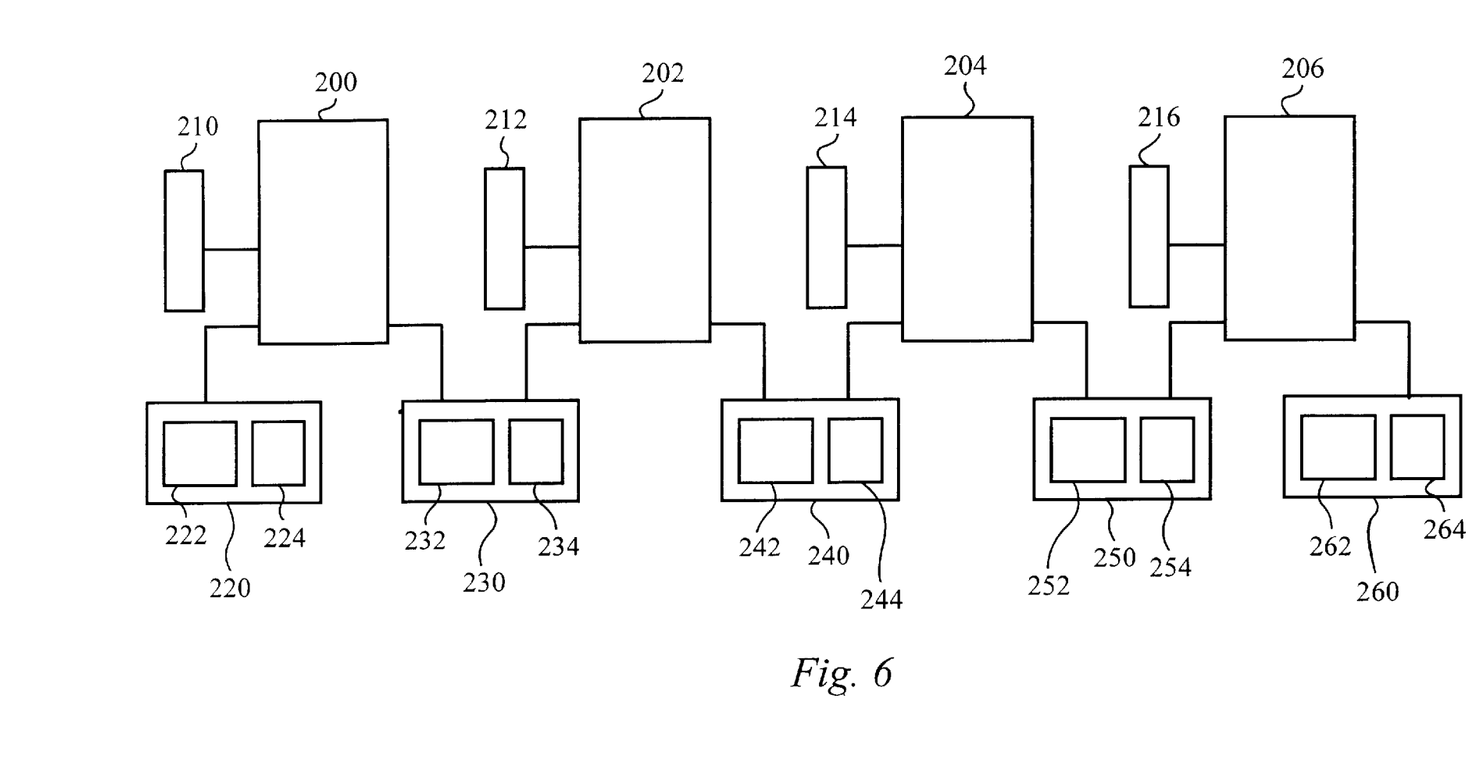
FIG. 6 illustrates a block diagram of a four array main memory system with shared redundancy circuits.

If a memory circuit includes more than two main memory arrays, the main memory arrays are preferably grouped into pairs for redundancy purposes. Each end main memory array preferably has a dedicated, corresponding, redundancy circuit and preferably shares a shared redundancy circuit, as illustrated in FIGS. 4 and 5. A block diagram of a four array main memory system with shared redundancy circuits is illustrated in FIG. 6. Each of the block memory arrays 200, 202, 204 and 206 is coupled to an individual memory controller 210, 212, 214 and 216, respectively. Each of the end block memory arrays 200 and 206 is coupled to a dedicated, redundancy memory circuit 220 and 260, respectively. A shared redundancy memory circuit 230 is coupled between the two block memory arrays 200 and 202. A shared redundancy memory circuit 240 is coupled between the two block memory arrays 202 and 204. A shared redundancy memory circuit 250 is coupled between the two block memory arrays 204 and 206.

The redundancy memory circuit 220 includes a redundant memory row array 222 and a redundancy decoder circuit 224. The redundancy memory circuit 230 includes a redundant memory row array 232 and a redundancy decoder circuit 234. The two block memory arrays 200 and 202 share the redundant memory row array 232 and the redundancy decoder circuit 234 within the shared redundancy circuit 230. The redundancy memory circuit 240 includes a redundant memory row array 242 and a redundancy decoder circuit 244. The two block memory arrays 202 and 204 share the redundant memory row array 242 and the redundancy decoder circuit 244 within the shared redundancy circuit 240. The redundancy memory circuit 250 includes a redundant memory array 252 and a redundancy decoder circuit 254. The two block memory arrays 204 and 206 share the redundant memory row array 252 and the redundancy decoder circuit 254 within the shared redundancy circuit 250. The redundancy memory circuit 260 includes a redundant memory row array 262 and a redundancy decoder circuit 264.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

We claim:

1. A method of providing redundant memory within a memory circuit comprising the steps of:
   a. fabricating a plurality of main memory arrays including groups of main memory cells;
   b. fabricating a redundant memory array including groups of redundant memory cells;
   c. testing the groups of main memory cells in order to determine if any of the groups of main memory cells include a defective memory cell; and
   d. substituting groups of redundant memory cells for groups of main memory cells including one or more defective memory cells if defective memory cells are discovered within the groups of main memory cells, wherein the groups of redundant memory cells are shared between the plurality of main memory arrays.

2. The method as claimed in claim 1 wherein the groups of redundant memory cells are rows within the redundant memory array and the groups of main memory cells are rows within the main memory arrays.

3. The method as claimed in claim 2 further comprising the steps of:
   a. determining an address for groups of main memory cells including one or more defective memory cells;
   b. assigning the address to a group of redundant memory cells which are substituted for the group of main memory cells found to include one or more defective memory cells; and
   c. disabling the group of main memory cells for which the group of redundant memory cells is substituted.

4. A redundant memory circuit configured for coupling to two main memory arrays and including a plurality of memory cells arranged into groups of redundant memory cells for substituting the groups of redundant memory cells for groups of defective main memory cells within the two main memory arrays.

5. The redundant memory circuit as claimed in claim 4 wherein the groups of redundant memory cells are rows within the redundant memory circuit.

6. The redundant memory circuit as claimed in claim 5 further comprising a redundancy address decoder coupled to the groups of redundant memory cells for matching a row address within the groups of redundant memory cells with a defective row address within one of the two main memory arrays whenever a defective memory cell is discovered.

7. An apparatus for providing redundant memory to a plurality of main memory arrays comprising:
   (1) a plurality of main memory arrays including groups of main memory cells; and
   (2) a redundant memory circuit including groups of redundant memory cells and coupled to the plurality of main memory arrays for substituting the groups of redundant memory cells for the groups of main memory cells including one or more defective memory cells.

8. The apparatus for providing redundant memory as claimed in claim 7 wherein the groups of redundant memory cells are formed within a redundant memory array which is shared between the plurality of main memory arrays.

9. The apparatus for providing redundant memory as claimed in claim 8 wherein the groups of redundant memory cells are rows within the redundant memory array and the groups of main memory cells are rows within the main memory arrays.

10. The apparatus for providing redundant memory as claimed in claim 7 further comprising:
    a. a means for determining an address of a group of main memory cells which is discovered to have one or more defective memory cells;
    b. a means for assigning an identical address to a group of redundant memory cells which are substituted for the group of main memory cells including one or more defective memory cells; and
    c. a means for disabling the group of main memory cells which are found to include the defective memory cell.

11. A redundancy memory configuration for a semiconductor memory device comprising:
    a. a plurality of main memory arrays each including a plurality of memory cells arranged in a matrix of main rows and main columns;
    b. a shared redundancy circuit coupled to the main memory arrays, including a plurality of redundancy rows; and
    c. a means for programming the shared redundancy circuit coupled between the main memory arrays and to the shared redundancy circuit for substituting one of the redundancy rows in the shared redundancy circuit for a main row having a defective memory cell.

12. The redundancy memory configuration as claimed in claim 11 wherein the means for programming includes a redundancy driving means for controlling access to the plurality of redundancy rows during memory read/write operations.

13. The redundancy memory configuration as claimed in claim 11 further comprising a redundancy address decoder which matches a row address within the plurality of redundancy rows with a defective row address within one of the main memory arrays whenever a defective memory cell is discovered.

14. The redundancy memory configuration as claimed in claim 11 wherein the means for programming includes a programmable array.

15. The redundancy memory configuration as claimed in claim 14 wherein the programmable array includes a plurality of programmable elements, wherein each programmable element is coupled to a row address of two main memory arrays and further wherein each programmable element is programmed if a defective cell is discovered within either row to which the programmable element is coupled.

16. A memory circuit comprising:
    a. a first main memory array including a first plurality of memory cells arranged into a first matrix of rows and columns;
    b. a first dedicated redundancy memory array coupled to the first main memory array and including a second plurality of memory cells arranged into first groups of redundant memory cells, wherein the first groups of redundant memory cells are substituted for memory cells within the first main memory array;
    c. a second main memory array including a third plurality of memory cells arranged into a second matrix of rows and columns;

d. a second dedicated redundancy memory array coupled to the second main memory array and including a fourth plurality of memory cells arranged into second groups of redundant memory cells; and e. a shared redundancy memory array coupled to both the first and second main memory arrays and including a fifth plurality of memory cells arranged into third groups of redundant memory cells which are substituted for memory cells within both the first and second main memory arrays.

17. The memory circuit as claimed in claim 16 further comprising a shared redundancy decoder coupled to the shared redundancy memory for substituting a row with a defective memory cell within a selective one of the first and second matrices with one of the third groups of redundant memory cells.

18. The memory circuit as claimed in claim 17 wherein the shared redundancy decoder includes a programmable array.

19. The memory circuit as claimed in claim 16 wherein the shared redundancy decoder includes a redundancy driver means coupled to the shared redundancy memory array for controlling access to the third groups of redundant memory cells during memory read/write operations.

\* \* \* \* \*